(12) United States Patent
Yamamura et al.

(10) Patent No.: US 7,911,769 B2
(45) Date of Patent: *Mar. 22, 2011

(54) ELECTRONIC CIRCUIT STRUCTURE, POWER SUPPLY APPARATUS, POWER SUPPLY SYSTEM, AND ELECTRONIC APPARATUS

(75) Inventors: Hideho Yamamura, Oiso (JP); Naoki Maru, Hadano (JP); Kazunori Nakajima, Sagamihara (JP); Koji Nisisu, Hadano (JP); Shigeo Oomae, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/487,279

(22) Filed: Jun. 18, 2009

(65) Prior Publication Data

US 2009/0257210 A1 Oct. 15, 2009

Related U.S. Application Data

(63) Continuation of application No. 11/260,210, filed on Oct. 28, 2005, now Pat. No. 7,548,411.

(30) Foreign Application Priority Data

Oct. 29, 2004 (JP) ................................ 2004-314996
Jan. 21, 2005 (JP) ................................ 2005-013473

(51) Int. Cl.
*H02B 1/20* (2006.01)

(52) U.S. Cl. .......................... 361/611; 361/775; 361/624

(58) Field of Classification Search .................. 361/611, 361/775, 637, 603, 620, 623–628, 781, 783, 361/715, 777, 719, 807, 704, 648; 174/70 B, 174/71 B, 72 B, 68.2 B, 88 B, 99 B; 257/712, 257/713, 719, 691; 165/80.3

See application file for complete search history.

(56) References Cited

U.S. PATENT DOCUMENTS

| | | |
|---|---|---|
| 5,067,043 A | 11/1991 | Markowski et al. |
| 5,742,005 A | 4/1998 | Saka et al. |
| 5,828,543 A | 10/1998 | Leveque |
| 5,877,944 A | 3/1999 | Onizuka |
| 6,049,043 A | 4/2000 | Tonejc |
| 6,116,916 A | 9/2000 | Kasai |
| 6,310,293 B1 | 10/2001 | Kawakita |

(Continued)

FOREIGN PATENT DOCUMENTS

JP 2002-345245 11/2002

*Primary Examiner* — Dameon E Levi
*Assistant Examiner* — Hoa C Nguyen
(74) *Attorney, Agent, or Firm* — Antonelli, Terry, Stout & Kraus, LLP.

(57) ABSTRACT

This invention prevents a deterioration of efficiency of a power supply apparatus due to a semiconductor power supply voltage drop, prevents an increase in wasted power, and prevents erroneous operations due to feeder wire voltage drop. In the mounting structure of electronic circuits having a plurality of busbars as current paths on a printed circuit board, the plurality of busbars have almost parallel portions spaced a predetermined distance apart; a span of the parallel portions of the plurality of busbars is greater than the predetermined distance; and in the parallel portions of the plurality of busbars, the plurality of busbars are connected by a wiring pattern. In the switching power supply apparatus built on a printed circuit board, with its output voltage of less than 2 V and its output current of more than 100 A, a means is provided for making the power efficiency higher than 70%.

5 Claims, 7 Drawing Sheets

U.S. PATENT DOCUMENTS

| | | |
|---|---|---|
| 6,409,522 B1 | 6/2002 | Onizuka |
| 6,547,572 B1 | 4/2003 | Burdick |
| 7,203,073 B2 | 4/2007 | Kawakita et al. |
| 2002/0021048 A1 | 2/2002 | Yamane et al. |
| 2004/0190272 A1* | 9/2004 | Takagi et al. ............... 361/775 |
| 2004/0242086 A1 | 12/2004 | Takagi |
| 2005/0094356 A1* | 5/2005 | Onizuka et al. ............. 361/611 |
| 2005/0219825 A1* | 10/2005 | Campini et al. ............. 361/719 |

* cited by examiner

FIG.1
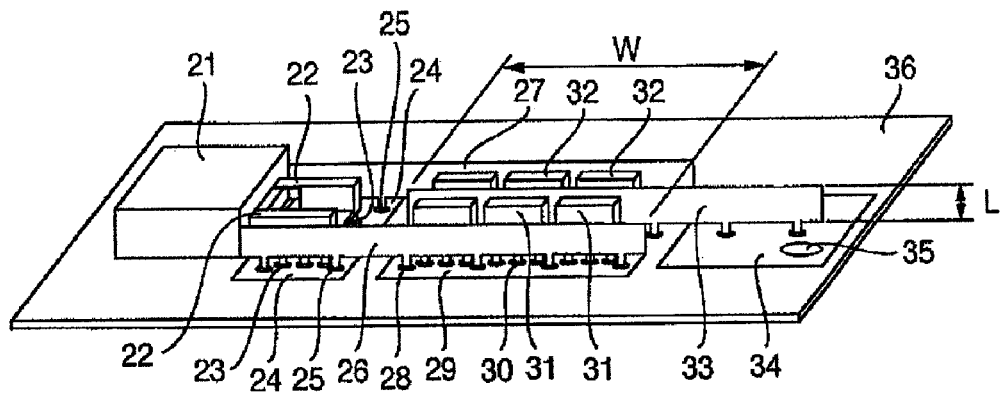
FIG.2
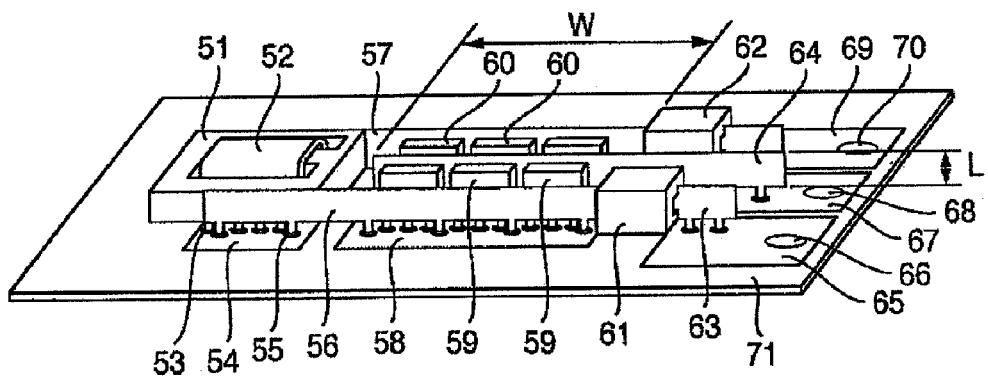
PRIOR ART FIG.3
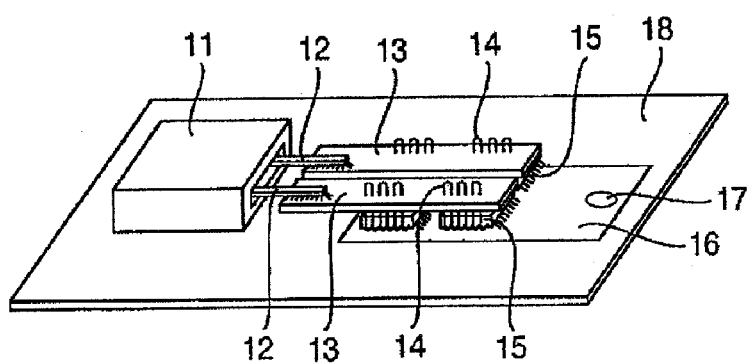

ELECTRONIC CIRCUIT STRUCTURE, POWER SUPPLY APPARATUS, POWER SUPPLY SYSTEM, AND ELECTRONIC APPARATUS

CROSS REFERENCE TO RELATED APPLICATION

This application is a Continuation of U.S. application Ser. No. 11/260,210, filed Oct. 28, 2005, which claims the priority benefit of Japanese Patent Application No. 2004-314996, filed on Oct. 29, 2004, and No. 2005-013473, filed on Jan. 21, 2005, the contents of which are incorporated herein by reference.

BACKGROUND OF THE INVENTION

The present invention relates to an electronic circuit mounting structure, a power supply apparatus, a power supply system, and an electronic apparatus.

In the power supply apparatus and system, a power efficiency is a very important performance.

The power efficiency is a ratio of an output power to an input power of the power supply apparatus or power supply system, and an electricity that is not used as an output is lost mainly as heat within the system. Thus, if the power efficiency is low, a large amount of heat is produced in the power supply system, which means a large amount of electricity is lost and not used by electronic circuits or load. This in turn requires a structure or mechanism for cooling the power supply apparatus and system, increasing the cost and size. In addition, this cooling structure such as fan consumes electricity, further deteriorating the power efficiency of the power supply system including the fan. A high power efficiency on the other hand reduces the amount of heat generated, cost and size and enhances the performance of the power supply apparatus and system, contributing to energy saving and prevention of global warming.

The output voltage of the power supply apparatus and system for semiconductor circuits is falling year by year, so their power efficiency is deteriorating. As for semiconductor circuits, a microfabrication technology to achieve higher performance and integration lowers their dielectric strength. This necessarily reduces the power supply voltage of the semiconductor circuits. However, because of increased density integration and faster operation speed, the current consumption tends to increase. As a result, semiconductor circuits of the same kind tend to have an almost constant power consumption, a lower supply voltage and an increased current consumption. To meet this tendency of the semiconductor circuits, the power supply apparatus and system used for the semiconductor circuits have a reduced output voltage. In the power supply apparatus in general, if its output voltage is lowered with its output current kept constant, the amount of heat generated does not change greatly, so its power efficiency deteriorates. The power supply apparatus and system used for semiconductor circuits are thus deteriorating in its power efficiency year by year.

Various technological developments have been conducted to improve the power efficiency of the power supply apparatus and system or prevent its deterioration. All these technologies are intended to reduce a power supply loss or heat.

A technology of a switching power supply has improved the power efficiency significantly compared with a voltage dropper type power supply apparatus, a technology prior to the switching power supply. The technology of the switching power supply has been widely known through many publications. Most power supplies for semiconductor circuits are the switching power supply.

Technologies for preventing switching losses in the switching power supply, such as a zero voltage switching, have been developed. The switching losses are produced by charging or discharging of electrostatic capacitance of semiconductor circuits. However, storing energy in a coil and performing a switching in an appropriate order enables switching elements to be switched in a state where a voltage applied to the switching elements is zero, thus eliminating the switching losses. This is the zero voltage switching technique. Also a zero current switching technique has been developed.

To reduce losses in a rectification section of a switching power supply, a synchronous rectification circuit technology has been developed. The switching power supply is a circuitry that generates an alternating current and then rectifies it and has often used semiconductor diodes in the rectification section. Because the semiconductor diodes have a forward voltage drop of 0.5V to 1V regardless of a passing current, a heat generation may pose a problem in a power supply with a large current output. Replacing these rectification devices with field effect transistors (FETs) and having them perform a rectification operation in synchronism with an ac power is the synchronous rectification circuit technology. This technology reduces the voltage drop, which occurs between electrodes of the rectification devices, down to about 0.1V, significantly reducing the amount of heat generated, compared with the conventional diodes. Since the voltage drop is determined by an on-state resistance of FET, it is proportional to the flowing current. So, when an output current of the power supply is small, the amount of heat generated is small; and when the output current is high, the generated heat amount is large, a characteristic that is advantageous to the power supply. As a result, the synchronous rectification circuit technology, when combined with the above zero voltage switching technology, results in most of the losses in the switching power supply being composed of ohmic losses caused by resistive components such as on-state resistances of switching devices, winding resistances of transformers and wiring resistances, except for small operation power in control circuits.

Efforts to reduce resistive components include a technique that uses thick wiring members such as a metal plate. As disclosed in JP-A 2002-345245, this technology uses a metal plate or busbar in a large current wiring path or main current path. The switching power supply is an electronic circuit and thus often employs a construction in which components are mounted on a printed circuit board for connection. Since the wiring portion forming the printed circuit board is normally made of a thin copper foil, it has a large electric resistance and generates a large amount of heat when a large current is applied. This technology is intended to reduce the electric resistance and therefore the heat generated, by using a metal plate or busbar, a thick wiring member, in the main current path that carries a large electric current, thereby improving the power efficiency of the power supply system. According to the conventional technology disclosed in JP-A 2002-345245, a transformer and an upper part of components are connected through a thick metal plate to reduce electric resistance and realize an improved power efficiency.

The conventional technology will be explained by referring to FIG. 3. On a printed circuit board 18 are mounted a transformer 11 and semiconductor devices 15. Winding leads 12 of the transformer 11 are connected to metal electrode members 13, which in turn are connected to terminals 14 of the semiconductor devices 15. Other terminals of the semiconductor devices 15 are connected to a wiring pattern 16 which is connected to an output terminal 17. That is, the interconnects between the transformer 11 and the semiconductor devices 15 are realized by the metal electrode members 13, and the interconnects between the semiconductor devices 15 and the output terminal 17 are realized by the wiring pattern 16.

In this example, a printed circuit board with a copper wiring pattern 16 measuring 35 μm thick by 10 mm wide by 50 mm long normally has a wiring resistance of about 2.5 mΩ. If the metal plate electrode members 13 are 1 mm thick, 10 mm wide and 50 mm long, its resistance is about 0.1 mΩ. Thus, a total wiring resistance is about 2.6 mΩ. Let us consider a case where all wires are wiring patterns on the printed circuit board. In this case, since the wires connecting the transformer 11 and the semiconductor devices 15 are also a wiring pattern on the printed circuit board, there are two wiring patterns with a resistance of about 2.5 mΩ and the total resistance is about 5 mΩ. The conventional technology therefore replaces one of the wiring patterns with a metal plate electrode member to reduce the total resistance to 2.6 mΩ, about one-half the resistance of the ordinary construction. If the same current flows, the amount of heat produced is proportional to a resistance. When a current of 50 A flows, the wiring with 5 mΩ produces a heat of about 12 W while the wiring with 2.6 mΩ produces heat of about 6.5 W, which is about a half of the former.

As described above, this conventional technology has an effect of halving the electric resistance and the amount of heat generated in the wiring.

Since this construction has outside the printed circuit board 18, rather than on the board, the connections between the terminals 14 of the semiconductor devices 15 and the metal plate electrode members 13, these members cannot be assembled during the ordinary manufacturing process of printed circuit boards. However, the use of manual soldering allows for a technically easy assembling, though it is costlier than an automatic assembling.

As described above, research and development efforts have been made to improve the power efficiency of power supply apparatus systems.

SUMMARY OF THE INVENTION

In a power supply system and electronic circuits, particularly those which produces a large current output at low voltage, there are cases where a power efficiency needs to be enhanced. That is, a large output current produces a large amount of heat. A lower output voltage results in a smaller output power for the same current and the amount of power lost in the form of heat relatively increases, reducing the power efficiency. To prevent this situation, there are cases where the power efficiency needs to be increased. This demand is growing remarkably in recent years as the operation voltage for semiconductors is decreasing.

With the development of the conventional technology, most of the losses in the power supply apparatus or the power supply system is caused by resistive components. The resistive components include an on-state resistance of switching devices, a winding resistance of a transformer and a wiring resistance. There are occasions where resistive components such as wiring resistance need to be reduced.

Particularly in recent years, performances of electronic components making up the power supply apparatus improve year by year, reducing the resistive components, with the result that the share of wiring resistance increases to about ⅓ the resistive component in some cases. Thus, the reduction in wiring resistance has become important.

Further, since the operation voltage of semiconductor devices is decreasing, allowable variations and errors of the power supply voltage is also decreasing. A demand for reducing a voltage drop caused by a current flowing through wires is also growing notably.

Further, there are cases where it is desired that an assembly be done in the ordinary printed circuit board manufacturing process for cost reduction while at the same time realizing a mounting structure with a small wiring resistance. That is, a structure may in some cases be required which allows for an automatic assembly without using a manual work.

According to one aspect, the present invention provides a mounting structure of electronic circuits having a plurality of busbars as current paths on a printed circuit board, wherein the plurality of busbars have almost parallel portions spaced a predetermined distance apart; wherein a span of the parallel portions of the plurality of busbars is greater than the predetermined distance; wherein in the parallel portions of the plurality of busbars, the plurality of busbars are connected by a wiring pattern.

According to another aspect, the present invention provides a switching power supply apparatus built on a printed circuit board, wherein its output voltage is less than 2 V and its output current is more than 100 A, the switching power supply apparatus having a means to make a power efficiency higher than 70%.

This invention has an effect of reducing the total resistance of wiring portion and also the amount of heat generated in an electronic circuit mounting structure, a power supply apparatus, an electronic circuit board or in a power supply system. Further, in the power supply apparatus or the power supply system, this invention has an effect of improving the power efficiency to 70% or higher. In the power supply system, this invention can reduce a cooling fan in size and weight or eliminate it, contributing to a reduction in the noise of fan and cost. Furthermore, in an electronic apparatus this invention has an effect of reducing power consumption.

BRIEF DESCRIPTION OF THE DRAWINGS

FIG. 1 is a perspective view of a first embodiment.

FIG. 2 is a perspective view of a second embodiment.

FIG. 3 is a perspective view showing a conventional technology.

DESCRIPTION OF THE EMBODIMENTS

Figure 4:
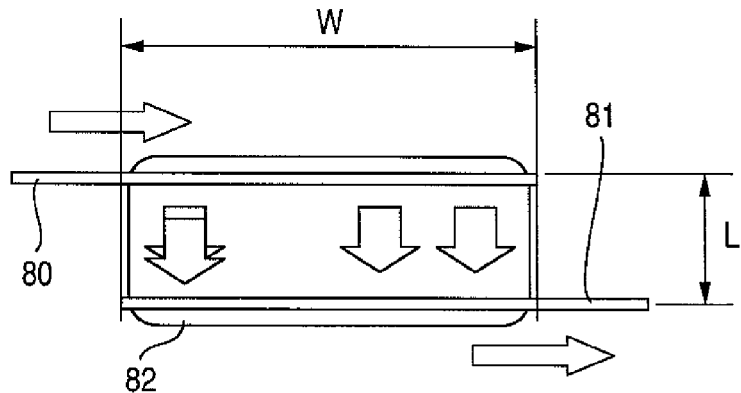
FIG. 4 is a conceptual diagram of this invention.

Now, embodiments of this invention will be described in detail.

1. Embodiment 1

FIG. 1 shows a mounting structure of an electronic circuit in a first embodiment of this invention and more specifically a mounting structure of a power supply circuit.

On a printed circuit board 36 are mounted a transformer 21, busbars 26, 27, 33 and semiconductor devices 31, 32. A winding lead 22 of the transformer 21 is shaped like pin terminals and connected to a busbar 26 via a through-hole 23, a wiring pattern 24 and a plurality of through-holes 25. The busbar 26 is shaped like pin terminals and connected to a busbar 33 via a through-hole 28, a wiring pattern 29, a through-hole 30, semiconductor devices 31 and wiring patterns (not shown) in an inner layer of the printed circuit board. The busbar 33 is connected through a wiring pattern 34 to an output terminal 35.

The similar construction is provided in a path from the transformer 21 to a busbar 27, semiconductor devices 32 and the busbar 33.

The busbars are metal plates independent of the structure of the printed circuit board and intended for carrying electric current.

In this construction, the busbars 26, 27, 33 are 2 mm thick, 10 mm wide and 100 mm long and were found to have a resistance of about 0.1 mΩ. The busbar 26 and the busbar 33 are arranged parallel to each other and spaced by a distance L of 10 mm. Their parallel overlapping portion W measures 50 mm. The wiring pattern between the busbar 26 and the busbar 33 has a plan view dimension of width W and length L, i.e., 35 μm thick, 50 mm wide and 10 mm long. As for the resistance, although a calculated resistance is 0.1 mΩ, its actual resistance was 0.2 mΩ because the wiring pattern is connected to the semiconductor devices 31 and complicated in shape. Therefore, the total resistance of the wiring formed between the busbar 26 and the busbar 33 was about 0.4 mΩ.

The winding leads 22 of the transformer 21 are shaped like a plate and connected to the printed circuit board via a plurality of through-holes and terminals. That is, they have a busbar structure. The winding leads 22 and the busbar 26 are arranged parallel to each other and spaced by a distance of 5 mm. Their parallel overlapping portion spans 25 mm. The wiring pattern between the winding leads 22 and the busbar 26 has a plan view dimension of about 5 mm in width and 25 mm in length. More specifically, the wiring pattern is 35 μm thick, 25 mm wide and 5 mm long and was found to have a resistance of about 0.1 mΩ. A total resistance of the wiring from the winding lead 22 of the transformer 21 to the busbar 33 was about 0.5 mΩ.

The wiring portion with a total resistance of 0.4-0.5 mΩ, when applied a current of 50 A, produces a heat of 0.75-1 W.

Compared with the total wiring resistance of about 2.6 mΩ in the conventional technology, this embodiment has a reduced total resistance of about 0.4-0.5 mΩ, one sixth to one fifth of the conventional total resistance. Similarly, the amount of heat produced is also reduced.

The busbars 26, 27, 33 and the winding leads 22 of the transformer 21 have a pin terminal structure and are inserted into through-holes for connection with the printed circuit board. These connections are similar in shape and method to the ordinary insertion type electronic components, so they can be assembled in the manufacturing process of ordinary printed circuit boards. This means that an automatic assembly can be used, lowering the manufacturing cost. Since the cost of the automatic assembly is one tenth that of manual assembly, the assembly cost of the busbars and metal plate electrode members in this embodiment was able to be reduced to one tenth.

The connection terminal structure can of course be changed from the pin type to any appropriate shape so that it can easily be used for surface mounting or surface connection, in addition to the through-hole insertion connection. The connection terminal may also be formed into a continuous shape longer or wider than the thickness of the busbar or metal plate, rather than a plurality of pin terminals. This type of connection terminal can also minimize the resistance of the connection, thus achieving the initial object of lowering the wiring resistance.

While in this embodiment, the shape of the busbar parallel portion and the shape of the wiring pattern almost match, the wiring pattern may be formed smaller than the busbar, e.g., the width of the wiring pattern may be set narrower or larger by several times. What is important is that the portion through which an electric current flows, i.e., the busbar parallel portion on the wiring pattern, is wide and short with respect to the direction of current flow. With this requirement met, the initial object of lowering the wiring resistance and therefore the heat generation can be realized.

Although this embodiment has taken up an application to a power supply apparatus as an example case, this mounting structure can be implemented in any electronic circuit. Since this structure has an effect of reducing the resistance, it can be suitably applied to those portions carrying a large current, such as power supply wiring portions, feeding portions, receiving portions and distribution portion in electronic circuits.

2. Embodiment 2

FIG. 2 illustrates a second embodiment of this invention of an electronic circuit mounting structure and more specifically a mounting structure of a power supply circuit.

The second embodiment has a similar structure to the first embodiment but there are also differences, which are described as follows.

The transformer 51 has one turn of a platelike secondary winding formed integral with a lead portion. The lead portion has a plurality of pin-shaped terminals inserted into through-holes 53 and soldered for connection with a wiring pattern 54 on a printed circuit board 71. A busbar 56 has a magnetic core 61 mounted thereon which functions as an inductance, forming an inductor for a smoothing filter required in a switching power supply circuit. Another busbar 57 also has the similar shape.

In this second embodiment, a large current path comprises two groups. A first group is made up of a path from the transformer 51 to the busbar 56 to an output terminal 66 and a path from the transformer 51 to the busbar 57 to an output terminal 70; and a second group is made up of a path from the transformer 51 to the busbar 56, semiconductor devices 59, a busbar 64 and to an output terminal 68 and a path from the transformer 51 to the busbar 57, semiconductor devices 60, the busbar 64 and to the output terminal 68.

In the first group wiring, the winding lead of the transformer 51 is shaped like a plate and connected to the printed circuit board through a plurality of through-holes and terminals. The winding lead is therefore a busbar structure. The winding lead and the busbar 56 are arranged parallel to each other, set apart by a distance of 5 mm. Their parallel overlapping portion is 25 mm long. A wiring pattern located between the winding lead and the busbar 56 has a plan view dimension of about 5 mm in width and 25 mm in length, more specifically 35 μm in thickness, 25 mm in width and 5 mm in length. The wiring pattern resistance was about 0.1 mΩ. The busbar including the inductor measures 2 mm thick by 10 mm wide by 150 mm long, and its resistance was about 0.15 mΩ. The current path including the busbar 57 also has the similar structure. Thus, the total resistance of the first group wiring was about 0.25 mΩ.

In the second group wiring, the wiring pattern 54 formed between the winding lead of the transformer 51 and the busbar 56 was found to have a resistance of about 0.1 mΩ as described above. The busbar itself, excluding the inductor, measures 2 mm thick by 10 mm wide by 100 mm long and has a resistance of about 0.1 mΩ. The busbar 56 and the busbar 64 are arranged parallel on a wiring pattern 58 at an interval L of 10 mm. The parallel overlapping portion W spans 50 mm. A wiring pattern provided between the winding lead and the busbar 56 has a plan view dimension of width W and length L, i.e., 35 μm thick, 50 mm wide and 10 mm long. Its shape is complex and thus its resistance was 0.2 mΩ. The busbar 64 is 2 mm thick, 10 mm wide and 100 mm long and its resistance was about 0.1 mΩ. The current path including the busbar 57 also has the similar structure. Therefore, the total resistance of the second group wiring was about 0.5 mΩ.

As described above, in the second embodiment, the total resistance of the wiring carrying a large current was in a range from 0.25 mΩ to 0.5 mΩ. In the conventional technology the total wiring resistance was about 2.6 mΩ, so this embodiment has reduced the total resistance down to 1/10 to 1/5.

In the mounting structure of the power supply circuit, the reason that the wiring resistance was able to be reduced is that the wiring employs a busbar with a thickness of 2 mm, substantially thicker than the wiring copper foil of the printed circuit board, and that the wiring patterns in the printed circuit board connecting a plurality of busbars are shaped so that its width is larger than the length. This is conceptually illustrated in FIG. 4 and FIG. 5.

Figure 5:
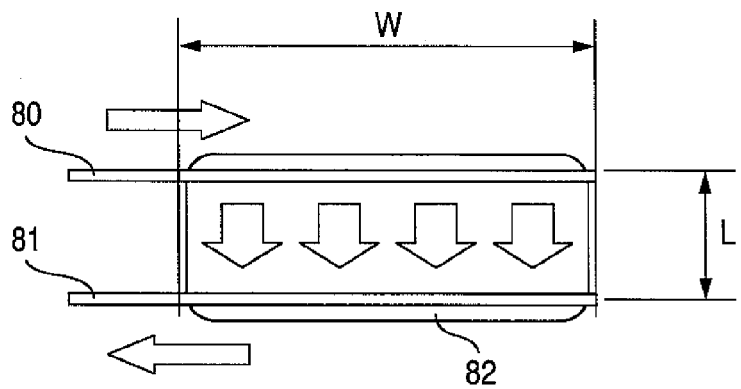
FIG. 5 is a conceptual diagram of this invention.

In FIG. 4 and FIG. 5, busbars 80 and 81 are arranged parallel to each other and their parallel overlapping portions are spaced by a distance L and span a width W. They are connected through a wiring pattern 82 on the printed circuit board. The wiring pattern 82 also has a width W and a length L. Arrows represent a flow of current. The busbars are formed of a relatively thick metal plate to reduce their resistance. The wiring pattern 82, because it is on the printed circuit board, is formed of a thin copper foil. But its resistance can be lowered by increasing its width and shortening its length. By setting the busbar and the wiring pattern so that their current directions are almost perpendicular, they can be connected.

As described above, a fundamental concept or feature of the present invention is that the wiring pattern connecting a plurality of busbars is constructed to have a width greater than its length.

What is described above is only a basic concept and therefore the wiring pattern may be formed into trapezoidal or other shapes, instead of a rectangular shape. The busbars need not be strictly parallel to each other or straight. The only requirement is that the wiring pattern have a greater width than its length with respect to the direction of current flow.

Further, as described in the first and second embodiment, this wiring pattern may be used for the connection of semiconductor devices and therefore may be divided. That is, the busbars almost parallel to each other are so arranged that the span of the parallel overlapping portions of the busbars is greater than their interval. As long as the parallel overlapping portions of the busbars are connected to each other through this wiring pattern, the object of this invention is achieved regardless of the detailed shape of the wiring pattern or whether the wiring pattern is divided or not.

Figure 9:
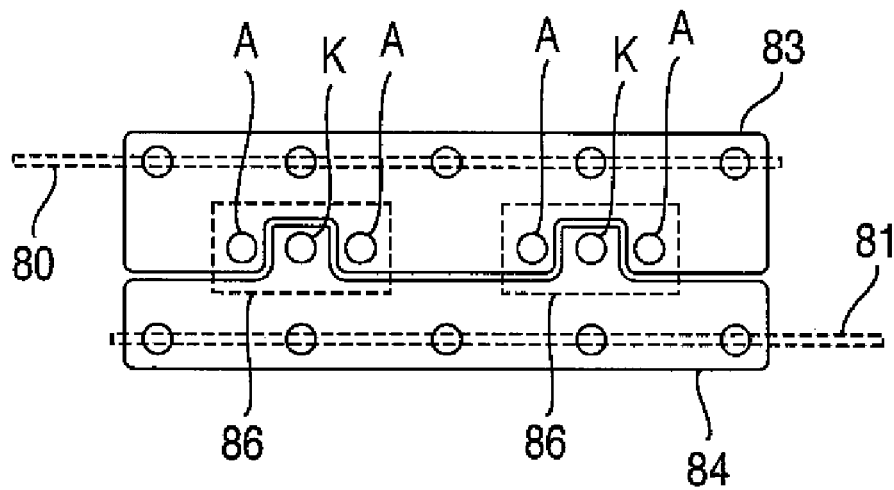
FIG. 9 is an example of the mounting structure of FIG. 4.
Figure 10:
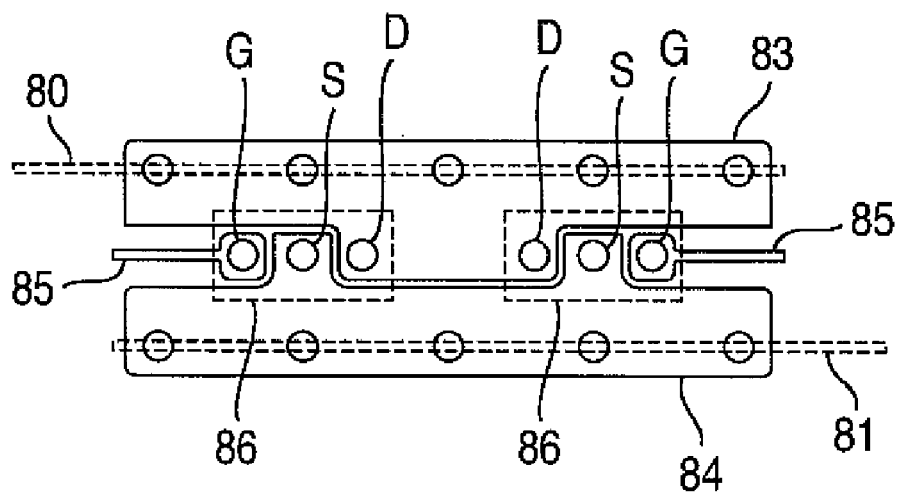
FIG. 10 is another example of the mounting structure of FIG. 4.

FIG. 9 and FIG. 10 show example mounting structures. In these figures, the busbar 80 and the busbar 81 are arranged parallel to each other and their parallel overlapping portions have a greater span than their interval. Between the parallel overlapping portions there are wiring patterns 83 and 84 on the printed circuit board which are connected to the busbars. The wiring patterns 83, 84 are connected with semiconductor devices 86.

The semiconductor devices 86 of FIG. 9 are a three-terminal device with two diodes built into it. An anode terminal of the diode is connected to an electrode A on the wiring pattern 83 and a cathode terminal of the diode is connected to an electrode K on the wiring pattern 83. In this circuit as a whole, a current flows from the busbar 80 into the wiring pattern 83, from which it passes through the semiconductor devices 86 to the wiring pattern 84 and to the busbar 81. The wiring patterns 83, 84 are spaced from each other by a distance smaller than their sizes. The semiconductor devices 86 are connected to the wiring patterns 83 and 84. If a plurality of semiconductor devices are to be connected in parallel, they need only be arranged in the width direction of the wiring patterns 83, 84 to increase their parallel number without disturbing the current path.

The semiconductor devices 86 shown in FIG. 10 are FETs (Field Effect Transistors), with their drain connected to an electrode D, source to an electrode S and gate to an electrode G. When applied a signal at their gate the FETs are switched. Since the signal to the gate is a small current, the feature size of the wiring pattern 85 is narrow. A large current flows from the busbar 80 to the wiring pattern 83, the semiconductor devices 86, the wiring pattern 84 and to the busbar 81. This current flow is similar to that of FIG. 9.

3. Embodiment 3

A third embodiment of this invention, though not shown, is a power supply printed circuit board made up of busbars, wiring patterns and electronic components. A wiring portion for supplying current to electronic components comprises busbars and wiring patterns, which is similar in construction to the first or second embodiment.

Since the wiring portion for supplying electricity has the similar construction to the first or second embodiment, the total resistance of wiring is reduced from the conventional 2.6 mΩ to 0.4 mΩ, which is 1/6.5 the conventional resistance. As a result, the amount of heat produced is also reduced to 1/6.5.

A voltage drop occurs when a current flows through a resistive wiring. When a current 50 A flows, the conventional wiring of 2.6 mΩ produced a voltage drop of 130 mV, whereas the wiring of this invention with a resistance of 0.4 mΩ has reduced the voltage drop to 1/6.5. In this embodiment, the wiring portion for current supply is used to supply a power of 3.3 V to the semiconductor devices. With the conventional structure, there are locations where a 3.9% or 130 mV voltage drop occurs, sometimes resulting in erroneous operations. With this invention, the magnitude of voltage drop is reduced to 40 mV at maximum or 1.2%, with the result that the erroneous operations are eliminated. As described above, this invention has contributed to the realization of stable operation of electronic circuits and to the improvement of reliability of electronic devices.

Even a power supply circuit printed circuit board intended solely for electric connections between printed circuit boards and having no electronic components mounted thereon, such as a backboard, can employ the technology of this invention to reduce the wiring resistance, the mount of heat generated and the voltage drop.

Further, this mounting structure can also be applied to component products or half-completed products of power supply apparatus, to power supply apparatus without a case or to a power supply module and realize the similar effects.

4. Embodiment 4

Figure 6:
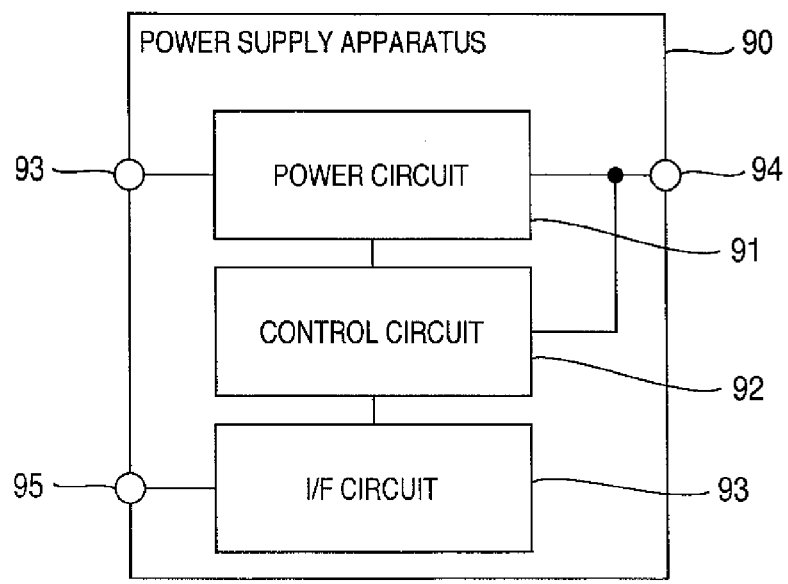
FIG. 6 is a schematic diagram showing a fourth embodiment.

FIG. 6 shows a power supply apparatus, a fourth embodiment of this invention.

In FIG. 6, a power supply apparatus 90 has a power circuit 91, a control circuit 92 and an interface circuit 93. The power circuit 91 has a mounting structure of the third embodiment of this invention. It receives a do power from an input terminal 96 and produces an output at an output terminal 94. The control circuit 92 is connected to the output terminal 94 and monitors a voltage at this point to control the power circuit 91. The interface circuit 93 is connected to the control circuit 92 and performs an on/off control on the power supply apparatus and a normal/abnormal state report, as required, through a terminal 95.

Figure 15:
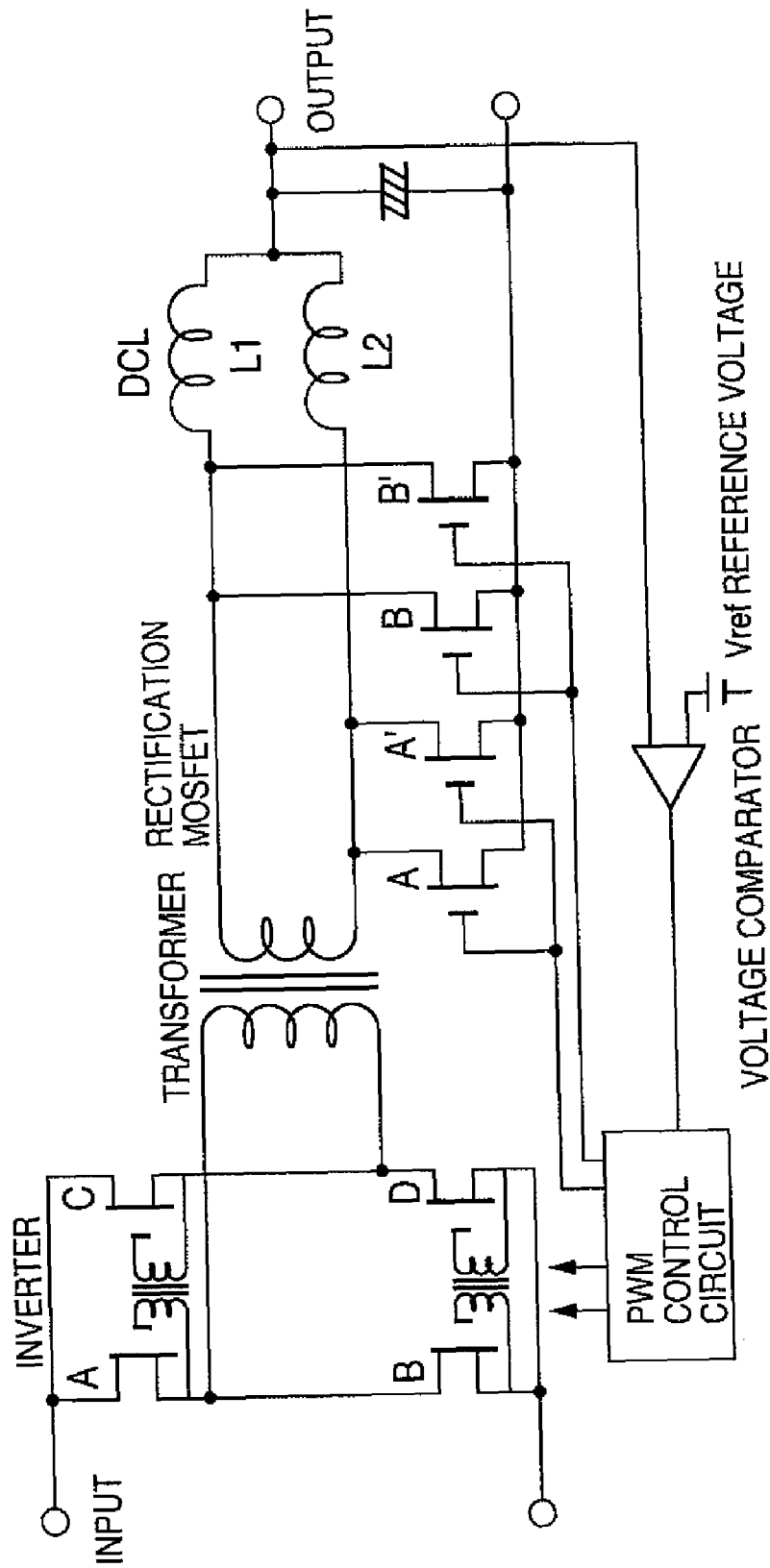
FIG. 15 is an example circuitry of a switching power supply that applies the present invention.

FIG. 15 shows an example power supply circuit diagram of a power supply apparatus comprising the power circuit 91 and the control circuit 92.

An inverter (MOSFET A-D) converts a dc voltage into an ac voltage by high-frequency switching and then the ac voltage undergoes insulation and voltage transformation by a transformer. The ac voltage is rectified by a rectification MOSFET (A-B'), smoothed by DCL (smoothing coil L1, L2) and capacitor, and output as a dc voltage. At this time, the output voltage is compared with a reference voltage by a voltage comparator, and a PWM control circuit controls the inverter and the rectification MOFET to make the output voltage a desired value.

This power supply apparatus uses the mounting structure of the first embodiment in the power circuit, so the total resistance of wiring portion is reduced to ⅙ to ⅕ that of the conventional technology. The amount of heat generated in the wiring portion also has decreased to ⅙ to ⅕. Therefore, the total amount of heat generated in this power supply apparatus is reduced in half and its power efficiency improved to more than 70%. The power efficiency is a ratio of the output power to the input power of the power supply apparatus 90.

Next, the amount of heat generated and the power efficiency of the power supply apparatus according to this invention will be described in detail by referring to FIG. 11 to FIG. 14.

Figure 11:
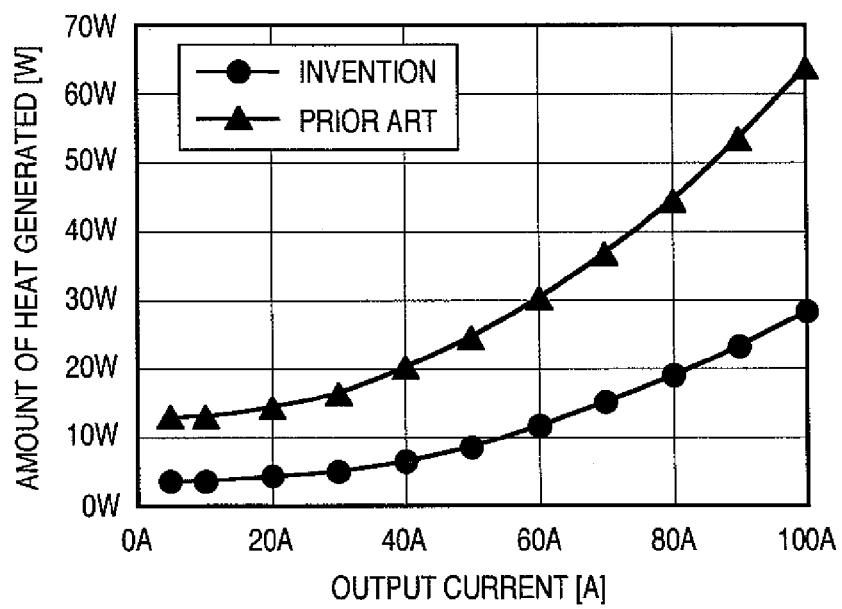
FIG. 11 is a graph showing the amount of heat produced.

FIG. 11 is a graph showing the amount of heat generated, with an abscissa representing an output current of the power supply and an ordinate representing the amount of heat generated. Two curves shown are a characteristic curve, marked ●, of the power supply according to this invention and a characteristic curve, marked ▲, of the conventional power supply. The output voltages of both power supplies are 1.2 V. In the entire range of the graph, the amount of heat generated by the power supply of this invention is less than one-half that of the conventional power supply. The power supply of this invention produces a small amount of heat.

Figure 12:
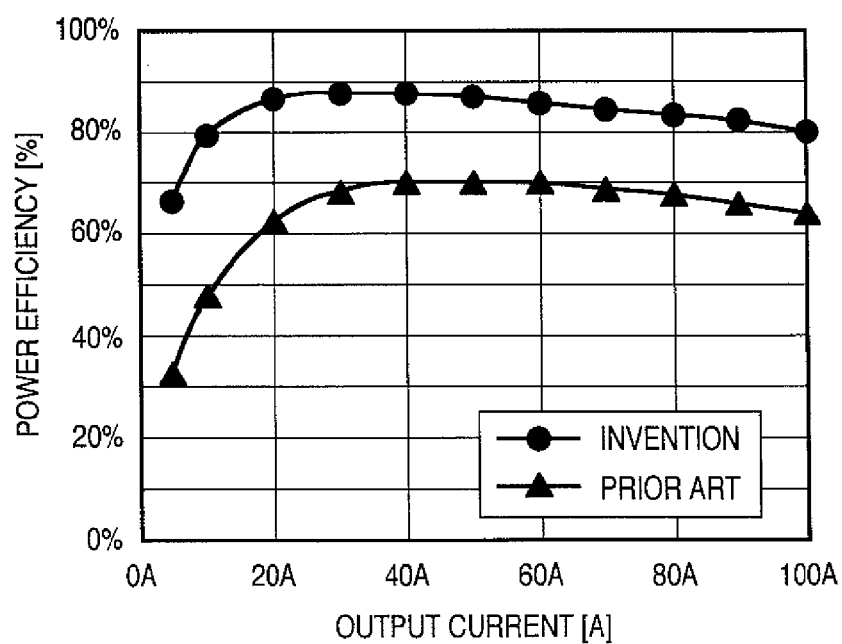
FIG. 12 is a graph showing power efficiencies.

FIG. 12 is a graph showing a power efficiency, with an abscissa representing an output current of the power supply and an ordinate representing a power efficiency. That is, this graph shows a ratio of an output voltage to an input voltage. The power efficiency of the power supply according to this invention is 80% to 90% in an output current range of between 10 A to 100 A. The conventional power supply has a power efficiency of 50% to 70% in the same current range. The power supply of this invention is higher in power efficiency than the conventional power supply.

In FIG. 12 the efficiency is high in the output current range of about 20 A to 60 A, but begins to deteriorate at a higher output current and droops at around 100 A. For a large current higher than about 100 A the power efficiency falls, so this invention contributes to improving the power efficiency. This tendency is significant, particularly with an insulating type power supply, i.e., one in which the power supply input side and the output side are isolated by a transformer.

Figure 13:
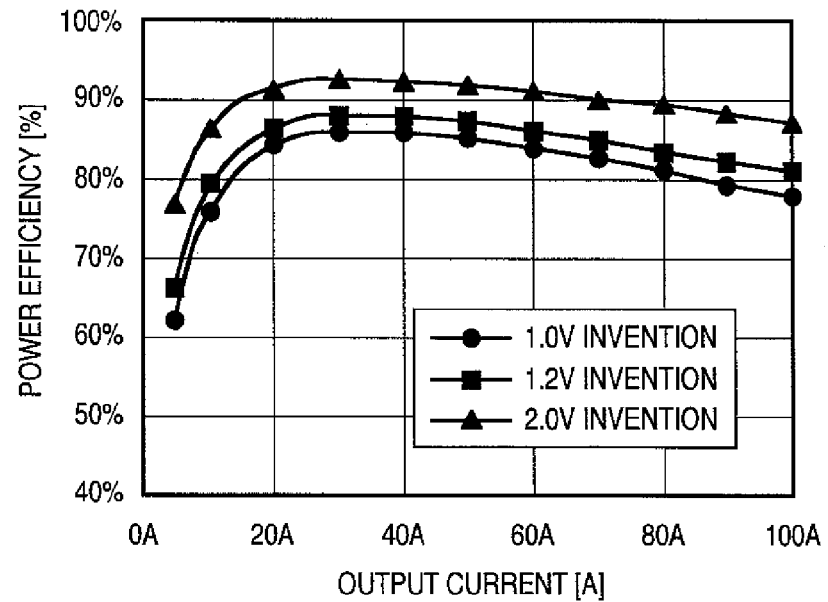
FIG. 13 is a graph showing power efficiencies for different output voltages.

FIG. 13 is a graph showing a power efficiency when the output voltage of a power supply of this invention is changed. Three characteristic curves shown are, from top to bottom, for an output voltage of 2 V, 1.2 V and 1.0 V. As the output voltage decreases, the efficiency deteriorates. This is a general, universally observed characteristic for any power supply. The technology of this invention has a remarkable efficiency improvement effect for an output voltage of 2 V or lower. This is explained as follows. As can be seen from this graph, for the output voltage higher than about 2 V, the power efficiency is high and there are no large power efficiency differences. Therefore, the technology of this invention has a significant power efficiency improvement effect for the output voltage of 2 V or lower.

Figure 14:
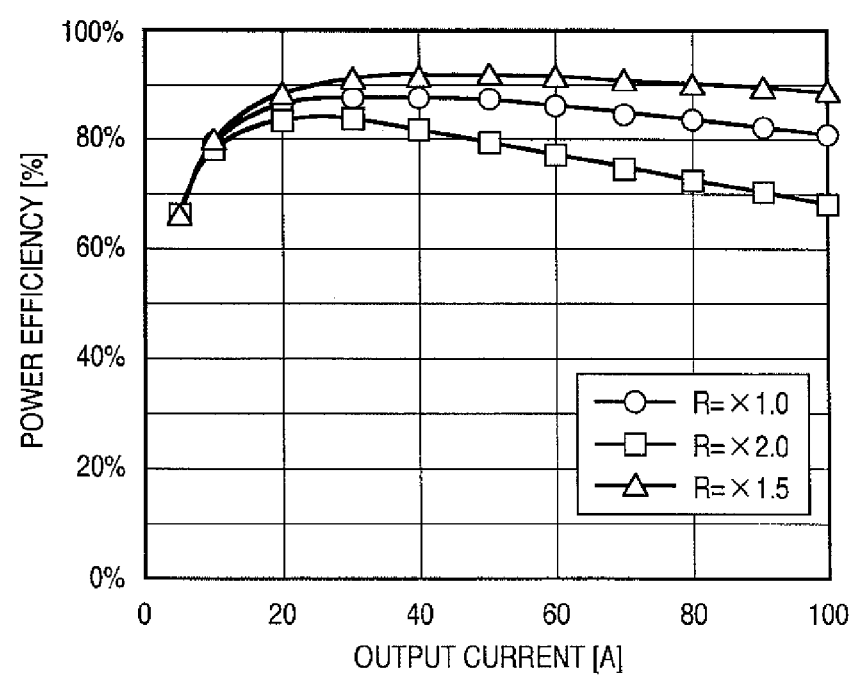
FIG. 14 is a graph showing power efficiencies for different numbers of parallel connections of semiconductor devices.

FIG. 14 is a graph showing a power efficiency when the parallel connection number of the semiconductors is changed. Characteristic curves represent, from top to bottom, a case where the semiconductor parallel number is increased by about three times (marked Δ), a case for the second embodiment (marked ○) and a case where the semiconductor parallel number is reduced almost in half (marked □). In the second embodiment, the power efficiency is 80% to 90% in the output current range of between 20 A and 100 A. When the semiconductor parallel number is increased by about three times to halve the total resistance component R, the power efficiency is 88% to 93% in the same current range. When the semiconductor parallel number is reduced almost in half, the power efficiency is 70% to 83% in the same current range. The semiconductor parallel number may be changed by a method that changes the span of the parallel overlapping portion of the busbars and by a method that increases or decreases the number of busbars. Depending on the size, shape and cost and according to a target output current, the power efficiency can be set arbitrarily in a range from about 70% to more than 90% or theoretically close to 100%. It is due to the effect of the technology of this invention that the design of a power supply with such a high power efficiency becomes possible.

The assembly process has conventionally required a manual work but this power supply apparatus allows for a fully automatic assembly process. As a result, the assembly time could be halved and the assembly cost reduced by 30%.

The use of the mounting structure of the second embodiment in the power circuit can produce the similar effect.

While the conventional structure uses a printed circuit board with 14 layers to make a copper pattern thick to reduce the resistance of wiring pattern as much as possible, the technology of this invention allows the printed circuit board to have only six layers. The reduced number of layers in the printed circuit board has resulted in the cost of printed circuit boards being reduced in half and the cost of power supply apparatus being reduced by 10%.

There are various types of power supply apparatus, including one with or without a control circuit, one with a complex control circuit, one with or without a cooling mechanism, one with a rectification circuit, one with an ac/dc converter, and one with a harmonic wave suppression function. In whatever type of the power supply apparatus, the same effect as described above can be obtained.

5. Embodiment 5

Figure 7:
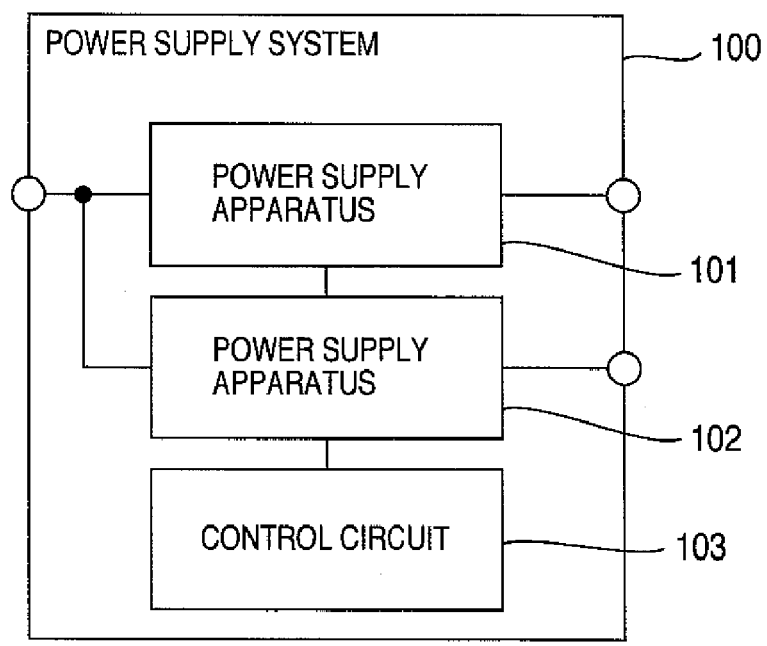
FIG. 7 is a schematic diagram showing a fifth embodiment.

FIG. 7 shows a power supply system as a fifth embodiment of this invention.

In FIG. 7, a power supply system 100 has power supply apparatus 101 and 102 and a control circuit 103. At least one of the power supply apparatus 101, 102 is the power supply apparatus of the fourth embodiment of this invention, and the control circuit 103 performs an on/off control and monitoring on the power supply.

Since the power supply system uses the power supply apparatus of this invention, the total resistance of the wiring portion is $1/10$ to $1/5$ that of the conventional technology and the amount of heat produced in the wiring portion is also $1/10$ to $1/5$ that of the conventional technology. Therefore, the total amount of heat produced in the power supply system is reduced to one-half and the power efficiency is improved to more than 70%. As a result, the cooling requirement can be met by a natural convection, making it possible to eliminate a cooling fan that has been required in the conventional technology. This in turn has resulted in reductions in size and cost.

Further, while the assembly process has conventionally required a manual work, the power system of this invention can be assembled fully automatically. As a result, the assembly time decreases to one half and the assembly cost is reduced by 30%.

Generally, there are various types of power supply system, including one with a plurality of power supply apparatus as in this embodiment, one with many power supply apparatus or with a single apparatus, one with or without a control circuit, one with a complex control circuit, and one with or without a cooling mechanism. In whatever type of power supply system, the same effect as described above can be produced.

6. Embodiment 6

Figure 8:
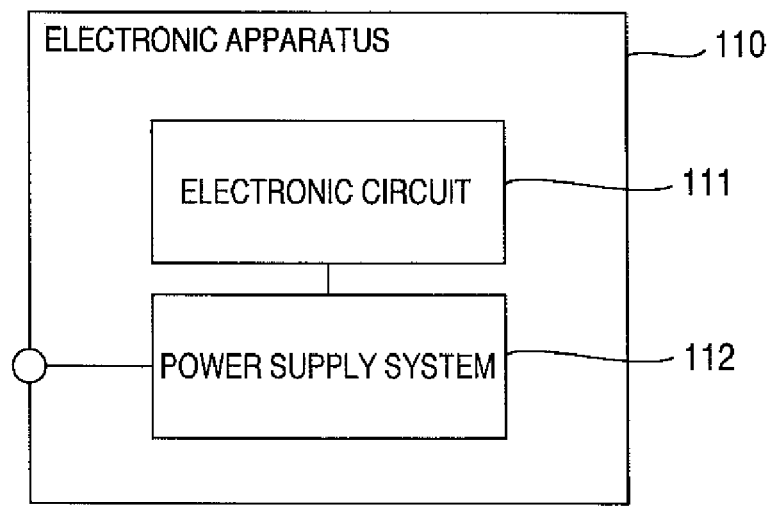
FIG. 8 is a schematic diagram showing a sixth embodiment.

FIG. 8 shows an electronic apparatus as a sixth embodiment of this invention.

In FIG. 8, an electronic apparatus 110 comprises a power supply system 112 and an electronic circuit 111. The power supply system 112 is the power supply system of the fifth embodiment of this invention and supplies electricity to the electronic circuit 111. The electronic circuit 111 partly uses the electronic circuit board of the third embodiment of this invention.

Since this electronic apparatus uses the power supply system of this invention, the power consumption of this electronic apparatus was able to be reduced by 15%. This in turn reduces the burden on a power receiving facility that supplies electricity to the electronic apparatus, and also reduces the size of the facility This will also lead to an elimination of a cooling facility for the electronic apparatus. Further, because of the small power consumption, the electronic apparatus of this invention can contribute to saving energy and oil and other resources. It can also make contributions to reducing emissions of global warming gases, such as carbon dioxides.

Further, since the power supply system of the electronic apparatus can be automatically assembled, the cost of assembling the electronic apparatus can also be reduced.

Further, in electronic apparatus for general users, many commercial power supply cables have a limitation of 15 A. An improved power efficiency of the power supply system allows 15% more electronic circuits to be mounted for the same power supply cable, improving the performance of the electronic apparatus.

Further, since the electronic circuit board of the third embodiment of this invention is used in the electronic circuit 111, the operation stability of the electronic circuit is improved, enhancing the reliability of the circuit operation by 10 times.

Although the above description has been made of example embodiments, it is apparent to those skilled in the art that the present invention is not limited to these embodiments and that various changes and modifications may be made without departing from the spirit of the invention or from the scope of the appended claims.

What is claimed is:

1. A power supply device comprising:
   a mounting structure for electronic circuits having a plurality of busbars as current paths on a printed circuit board;
   a power circuit; and
   a control circuit for controlling the power circuit,
   wherein the plurality of busbars have almost parallel portions spaced a predetermined distance apart,
   wherein a span of the parallel portions of the plurality of busbars is greater than the predetermined distance,
   wherein in the parallel portions of the plurality of busbars, the plurality of busbars are connected by a wide wiring pattern whose width is larger than its length with respect to a direction along which a current flows, and
   wherein the wide wiring pattern which connects a pair of adjacently located first and second busbars is arranged in such a manner that its width is larger than its length with respect to a direction along which a current flows from the first busbar to the second busbar.

2. A power supply system comprising:
   a mounting structure for electronic circuits having a plurality of busbars as current paths on a printed circuit board; and
   a power source for supplying power to the electronic circuits,
   wherein the plurality of busbars have almost parallel portions spaced a predetermined distance apart,
   wherein a span of the parallel portions of the plurality of busbars is greater than the predetermined distance,
   wherein in the parallel portions of the plurality of busbars, the plurality of busbars are connected by a wide wiring pattern whose width is larger than its length with respect to a direction along which a current flows, and
   wherein the wide wiring pattern which connects a pair of adjacently located first and second busbars is arranged in such a manner that its width is larger than its length with respect to a direction along which a current flows from the first busbar to the second busbar.

3. A power supply system comprising:
   a mounting structure for electronic circuits having a plurality of busbars as current paths on a printed circuit board;
   a power source device including a power circuit and a control circuit for controlling the power circuit; and
   a power source for supplying power to the power source device,
   wherein the plurality of busbars have almost parallel portions spaced a predetermined distance apart,
   wherein a span of the parallel portions of the plurality of busbars is greater than the predetermined distance,
   wherein in the parallel portions of the plurality of busbars, the plurality of busbars are connected by a wide wiring pattern whose width is larger than its length with respect to a direction along which a current flows, and wherein the wide wiring pattern which connects a pair of adjacently located first and second busbars is arranged in such a manner that it's width is larger than its length with respect to a direction along which a current flows from the first busbar to the second busbar.

4. An electric device comprising:

a mounting structure for electronic circuits having a plurality of busbars as current paths on a printed circuit board; and a power source for supplying power to the electronic circuits, wherein the plurality of busbars have almost parallel portions spaced a predetermined distance apart, wherein a span of the parallel portions of the plurality of busbars is greater than the predetermined distance, wherein in the parallel portions of the plurality of busbars, the plurality of busbars are connected by a wide wiring pattern whose width is larger than its length with respect to a direction along which a current flows, and wherein the wide wiring pattern which connects a pair of adjacently located first and second busbars is arranged in such a manner that its width is larger than its length with respect to a direction along which a current flows from the first busbar to the second busbar.

5. An electric device comprising:

a mounting structure for electronic circuits having a plurality of busbars as current paths on a printed circuit board;

a power source device including a power circuit and a control circuit for controlling the power circuit; and a power source for supplying power to the power source device, wherein the plurality of busbars have almost parallel portions spaced a predetermined distance apart, wherein a span of the parallel portions of the plurality of busbars is greater than the predetermined distance, wherein in the parallel portions of the plurality of busbars, the plurality of busbars are connected by a wide wiring pattern whose width is larger than its length with respect to a direction along which a current flows, and wherein the wide wiring pattern which connects a pair of adjacently located first and second busbars is arranged in such a manner that its width is larger than its length with respect to a direction along which a current flows from the first busbar to the second busbar.

* * * * *